United States Patent [19]
Brown et al.

[11] Patent Number: 5,570,383
[45] Date of Patent: Oct. 29, 1996

[54] TIMING HAZARD DETECTOR ACCELERATOR

[75] Inventors: Benjamin J. Brown, Westlake Village; Peter A. Reichert, Thousand Oaks, both of Calif.

[73] Assignee: Teradyne, Inc., Boston, Mass.

[21] Appl. No.: 290,477

[22] Filed: Aug. 15, 1994

[51] Int. Cl.[6] .................................................. G06F 11/00
[52] U.S. Cl. ...................... 371/62; 364/266; 364/DIG. 1
[58] Field of Search .................................. 371/1, 3, 57.1, 371/61, 62; 364/550, 265, 266

[56] References Cited

U.S. PATENT DOCUMENTS

| | | | |
|---|---|---|---|
| 4,620,302 | 10/1986 | Binoeder et al. | 371/25.1 |
| 4,806,852 | 2/1989 | Swan et al. | 371/62 |
| 4,972,412 | 11/1990 | Satoh | 371/62 |
| 5,341,091 | 8/1994 | Kurita | 371/62 |
| 5,355,321 | 10/1994 | Grodstein et al. | 364/489 |
| 5,357,195 | 10/1994 | Gasbarro et al. | 371/25.1 |

OTHER PUBLICATIONS

Soboleski, "Using High Level Design Models for Generation of Test Vectors" IEEE pp. 345–348.
Gasbarro et al "Integrated Pin Electronics for VLSI Functional Testers" IEEE 1989 pp. 331–337.
Low et al. "An Integrated Functional Tester for CMOS Logic" 1993 IEEE pp. 453–456.

Primary Examiner—Robert W. Beausoliel, Jr.
Assistant Examiner—Albert Décady
Attorney, Agent, or Firm—Edmund J. Walsh

[57] ABSTRACT

Apparatus and method for detecting timing hazards which might be introduced in a pattern for execution on a tester when edges are improperly programmed in the pattern. The apparatus includes hazard detection circuits associated with the pins of the tester. Each circuit receives control inputs which specify which edges are involved in the hazard and limits on the permissible time between the specified edges. In operation, the pattern is executed repeatedly, once for each hazard which must be detected. The programmed times for the selected edge as well as the drive and format for each period of the pattern are variable inputs to the circuit.

20 Claims, 3 Drawing Sheets

TIMING HAZARD DETECTOR ACCELERATOR

This invention relates generally to automatic test equipment and more specifically to methods and apparatus for detecting timing hazards in test patterns written for automatic test equipment.

Automatic test equipment (called simply a "tester") is used to test electronic components and devices as they are being manufactured. The tester has numerous signal lines (called "pins") which connect to the device under test ("DUT"). Stimulus signals are placed on some of these lines and the response of the DUT is measured on other lines. By comparing the response received from the DUT to an expected response, faults in the DUT may be detected.

State of the art test systems are controlled by very fast computers which run programs called "patterns." The pattern contains information about the stimulus signals that should be applied, the order in which those signals should be applied and the expected response from the DUT. This information for any cycle of the tester is called a "vector." The pattern is, thus, made up of a series of vectors. A typical pattern for a tester designed to test VLSI components can have over one million vectors.

A tester must be able to test various types of devices. For that reason, great flexibility must be allowed in developing patterns. It is not sufficient for a user to program just the values on each pin. It is necessary that the signals which apply that value be able to change at precisely defined times. Accordingly, testers include timing generator circuits which generate many timing signals. All signal transitions and measurements in the tester are synchronized to one of these timing signals. To provide flexibility, the user can specify when each timing signals occurs.

The basic timing value which the timing generator provides is the period clock. Each cycle of the period clock defines one period of tester operation. The frequency of the period clock may be programmed by the user. The period clock defines how fast the tester is running because one vector is executed for each cycle of the period clock.

Several other timing signals are also generated by the timing generator. These timing signals typically occur once during each period of tester operation, but in some testers a timing signal may occur multiple times in one period or not at all. The user programs how long after the start of the cycle each timing signal occurs. For example, if a certain comparison operation is synchronized to a timing signal and that signal has been programmed to occur 50 nsec after the start of each period, when a vector is executed which specifies that type of comparison, the comparison is started 50 nsec after the start of the cycle In addition to defining the start of events, some timing signals are used to define the ends of events. For example, one timing signal could be used to define the start of an output signal to be applied to a DUT. A second timing signal would define the end of that output signal. In this way, the user has great flexibility to specify not only when the output will occur but also how long it lasts. Because the timing signals used in this fashion specify the transitions in a signal or the "edges" of pulses, the timing signals are sometimes called "edge signals" or just "edges." Specifying when an edge is to occur is sometimes called "placing the edge."

The information specifying when all the edges should occur within one period is called an "edgeset." A tester can be programmed with multiple edgesets so that the timing signals can have different relationships at different points during the execution of a pattern. Each vector contains information that specifies which edgeset to use for that vector. Thus, great flexibility in specifying timing is provided.

The drawback of having all this flexibility is that it is possible for a user to specify timing conditions that the tester can not meet. These conditions are called "hazards." One type of hazard is called an intra-period hazard. This type of hazard occurs when an edgeset has been programmed to require the tester to generate signals during one period which the tester can not generate. For example, if one edge signal marks the beginning of an output pulse and a second edge signal marks the end of that pulse, these edges must be programmed such that the second edge occurs after the first edge. They also must be programmed such that the time between these edges is longer than it takes for the hardware producing the output signal to respond. Otherwise, the hardware will receive the timing signal ending the output before it has produced an output and an incorrect output will result.

The second type of hazard is called an inter-period hazard. This type of hazard occurs when the placement of edges in successive periods combine to specify timing conditions that the tester can not meet. One way that an inter-period hazard can occur is when a vector selects a different edgeset than the previous vector, requiring the tester to generate edges closer together than it is able. For example, if the first edgeset requires that a particular edge be generated 5 nsec before the end of a period and the second edgeset requires that the same edge be generated 5 nsec after the start of the period, the tester is required to repeat the same edge after only 10 nsec. Even though each edgeset taken separately is programmed correctly, when combined they produce a hazard if the tester requires more than 10 nsec before it can repeat the edge. A second example of an inter-period hazard is when one edge triggers an output driver and a second edge resets the driver. The trigger and reset might be amply spaced within any given period. However, if the reset edge is very close to the end of one period and a drive edge is programmed very close to the beginning of the following period, the drive edge might be too close to the reset edge for the tester to correctly respond.

To avoid hazards, tester manufacturers provide a timing specification for the tester. The specification lists for each edge the minimum time that must elapse before that edge is repeated. For each pair of edges, the specification also lists the minimum time that must elapse between the first edge and the second edge, if there such a minimum exists. Where there are maximum times that can elapse between edges, those conditions are also listed in the specification. The specification is complicated because the tester can produce signals with different formats and the timing restrictions will be different when different formats are used. For example, a tester might operate with a return low format such that there must be some minimum time between the edge which starts the output and the edge which ends the output. When operated in a non-return format, no such restriction applies.

Avoiding timing hazards is very difficult because of the number of variables that must be considered. To assist users avoid hazards, tester manufacturers provide programs which analyze patterns for timing hazards. Testers typically are connected to a computer work station which loads patterns into the tester and provides a user interface for initiating tests and analyzing results provided by the tester. These hazard detection programs run on a work station computer which may or may not be attached to the tester. They analyze each edgeset for intra-period hazards. They also step through each pattern and examine the edgesets selected by each vector and locate inter-period hazards.

There are two major drawbacks to these types of programs. First, they run very slowly. The program must step through millions of vectors, comparing timing differences between multiple edges for each pin of each vector. Even on a very fast work station, running a hazard detection program could take hours or even a full day. Moreover, as testers are enhanced to test devices with more pins, the number of computations these programs must make will increase, slowing them further. A second drawback is that these programs detect potential hazards based on violations of the timing specification. Many potential hazards which are detected by these programs will not actually interfere with the operation of the tester. For example, the program would identify as a hazard a condition which required the start of an output edge in one period to occur too close to the same edge in the preceding period. However, if the data written to the pin being driven by those timing signals did not require that any value be driven on that output, no error will result. Since each hazard reported by the program must be either changed or determined not to produce an error, valuable engineering time is wasted by having a computer program which reports hazards which do not result in an error.

SUMMARY OF THE INVENTION

With the foregoing background in mind, it is an object of this invention to provide a method of rapidly detecting timing hazards in a tester.

It is an object to provide a method of rapidly identifying hazards in a pattern, the method's execution time does not depend on the number of pins on a device under test which the pattern tests.

It is also an object to provide a method of identifying actual hazards without identifying all potential hazards.

The foregoing and other objects are achieved by incorporating a hazard detection accelerator into a tester. The accelerator comprises a plurality of circuits, each receiving the timing information for one pin of the tester.

In a preferred embodiment, the circuit contains means for computing the programmed time difference between selected timing signals and means for determining the minimum permissible time difference between those timing signals. The circuit also contains a means for determining if the programmed time difference is less than the minimum permissible time difference.

In one embodiment, the means for determining the minimum permissible time difference includes a lookup table that stores minimum permissible time differences between timing signals under different data and format conditions. The table may be addressed by specifying the selected timing signals, the data and format command for the associated pin of the tester during the current and prior test cycles.

In operation, the tester is controlled to execute a test pattern a plurality of times. For each execution of the pattern, the hazard detection accelerator is programmed to identify certain types of hazards.

BRIEF DESCRIPTION OF THE DRAWINGS

The invention will be better understood by reference to the following more detailed description and accompanying drawings is which

DESCRIPTION OF THE PREFERRED EMBODIMENT

Figure 1:
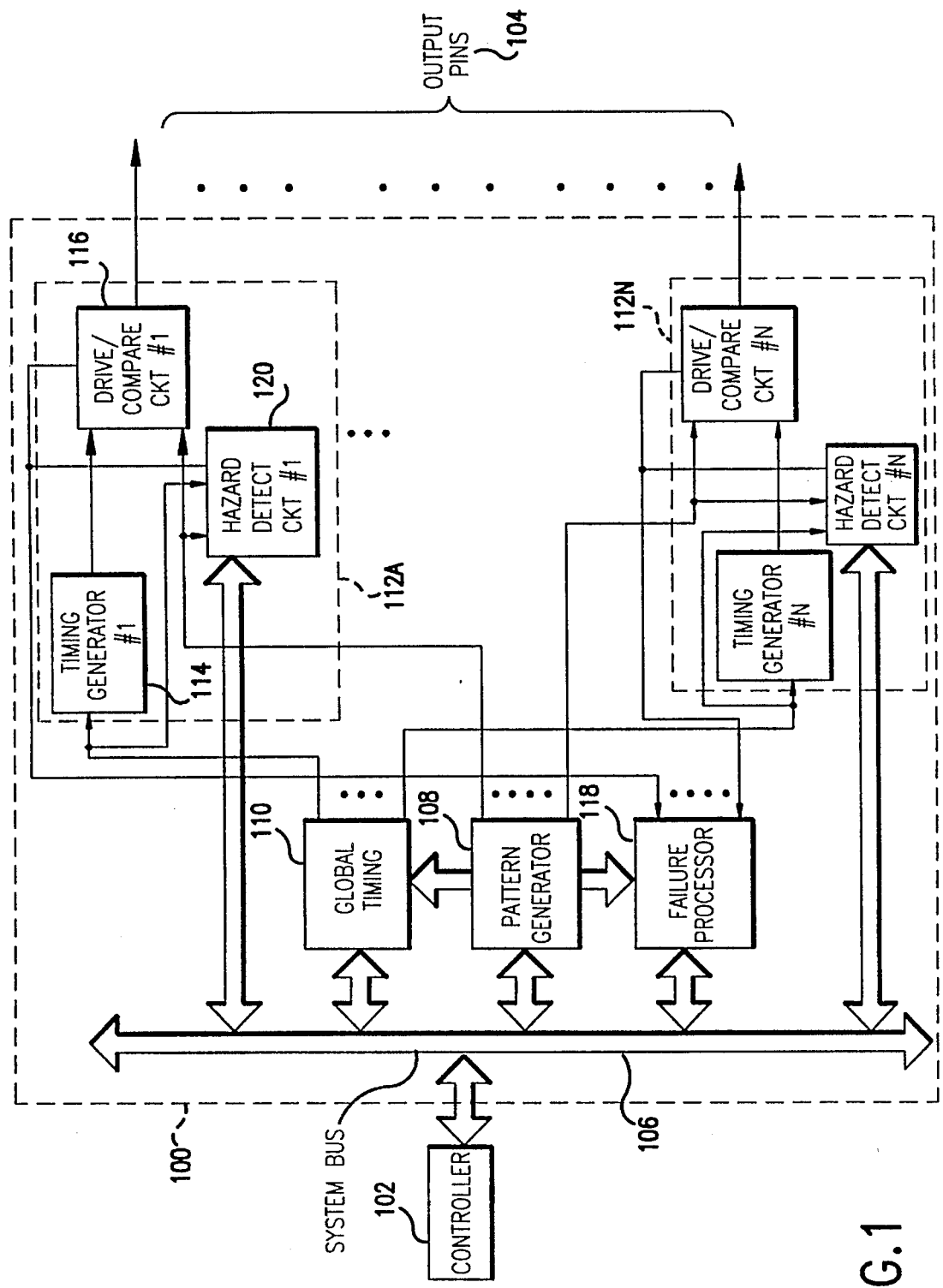
FIG. 1 is a block diagram of a tester incorporating the invention.

FIG. 1 shows a block diagram of tester 100 which incorporates hazard detection circuitry according to the invention. Tester 100 is controlled by computer controller 102, which is typically a computer work station.

Tester 100 has a plurality of pins 104. To execute a test pins 104 are connected to a DUT (not shown). In detecting hazards according to the invention, it is not important whether a DUT is connected to pins 104.

During a test, signals are output or received over pins 104 according to a pattern generated by pattern generator 108. Pattern generator 108 executes vectors that have been programmed into the tester in order to produce the pattern. Pattern generator 108 is connected to controller 102 over system bus 106.

Controller 102 loads the pattern into pattern generator 108 and provides control signals which initiate the execution of the pattern. Controller 102 also provides data and commands to other parts of the system over system bus 106. Information about which hazards to detect, represented as the commands and data for various system elements, is also provided by controller 102 over system bus 106.

The timing of when test signals are applied to and read from pins 104 is controlled by global timing circuit 110. Global timing circuit 110 receives from pattern generator 108 an indication of which edgeset to use for generating timing signals on each pin. Global timing circuit 110 then sends information to each of the pin electronics units 112A ... 112N indicating when each timing signal, or edge, for that pin should be generated.

Pin electronics 112 contains a timing generator 114. Timing generator 114 accepts the signal indicating when each edge should occur and generates the edge signal at the appropriate time. Each edge signal is connected to drive/compare circuit 116.

Drive/compare circuit 116 is also connected to pattern generator 108. Pattern generator 108 specifies such things as whether drive/compare circuit 116 should drive pins 104 or compare the values on pins 104 to some value. The information provided by pattern generator 108 includes data which specifies to what value the pin 104 should be driven or compared. When drive/compare circuit 116 is operated to compare the value on a pin 104 to some value, it provides an output to failure processor 118 when the value on the pin does not match the compared value.

Failure processor 118 stores information when there is a failure. During execution of a pattern to test a DUT, it stores information such as the pin at which the failure occurred, the actual value received at pins 104 and the vector being executed by pattern generator 108 at the time of the failure. Failure processor 118 is connected to pattern generator 108 for obtaining information which is stored. When tester 100 is being used to detect timing hazards, failure processor 118 stores information when a hazard is detected. It stores such information as the pin at which the hazard occurred, the vector being executed by pattern generator 108 when the failure occurred, the edgeset in use by the vector being executed when the hazard was detected, the edgeset in use by the vector executed prior to the current vector and the type of hazard detected. In addition to being available from pin electronics 112 and pattern generator 108, this information is available to failure processor over system bus 106.

When tester 100 is being operated in hazard detection mode, failure processor 118 receives an indication that a hazard has occurred from hazard detection circuit 120. Hazard detection circuit 120 is shown in greater detail in FIG. 2. Suffice it to say here that hazard detection circuit 120 receives data and commands from controller 120 over system bus 106. It receives from global timing circuit 110 an indication of when each edge has been programmed to occur as well as an indication of the length of a period. In addition, hazard detection circuit 120 receives from pattern generator 108 the drive and format data supplied to drive/compare circuit 116. Hazard detection circuit 120 is programmed with the timing specification for tester 100. If for any vector the combination of the programmed timing values, drive data and output format violates the timing specification, a hazard is indicated.

Pins 104, system bus 106, pattern generator 108, global timing circuit 110, timing generator 114 and drive compare circuit 116 are parts which might be found in a conventional tester. Controller 102 is very much like a controller that might be found in a conventional tester except that it incorporates a hazard detection program as is explained in greater detail in conjunction with FIG. 3 below. Failure processor 118 is also very much like the failure processor in a conventional tester except that it has been modified to store slightly different information in response to a hazard as opposed to a failure.

Figure 2:
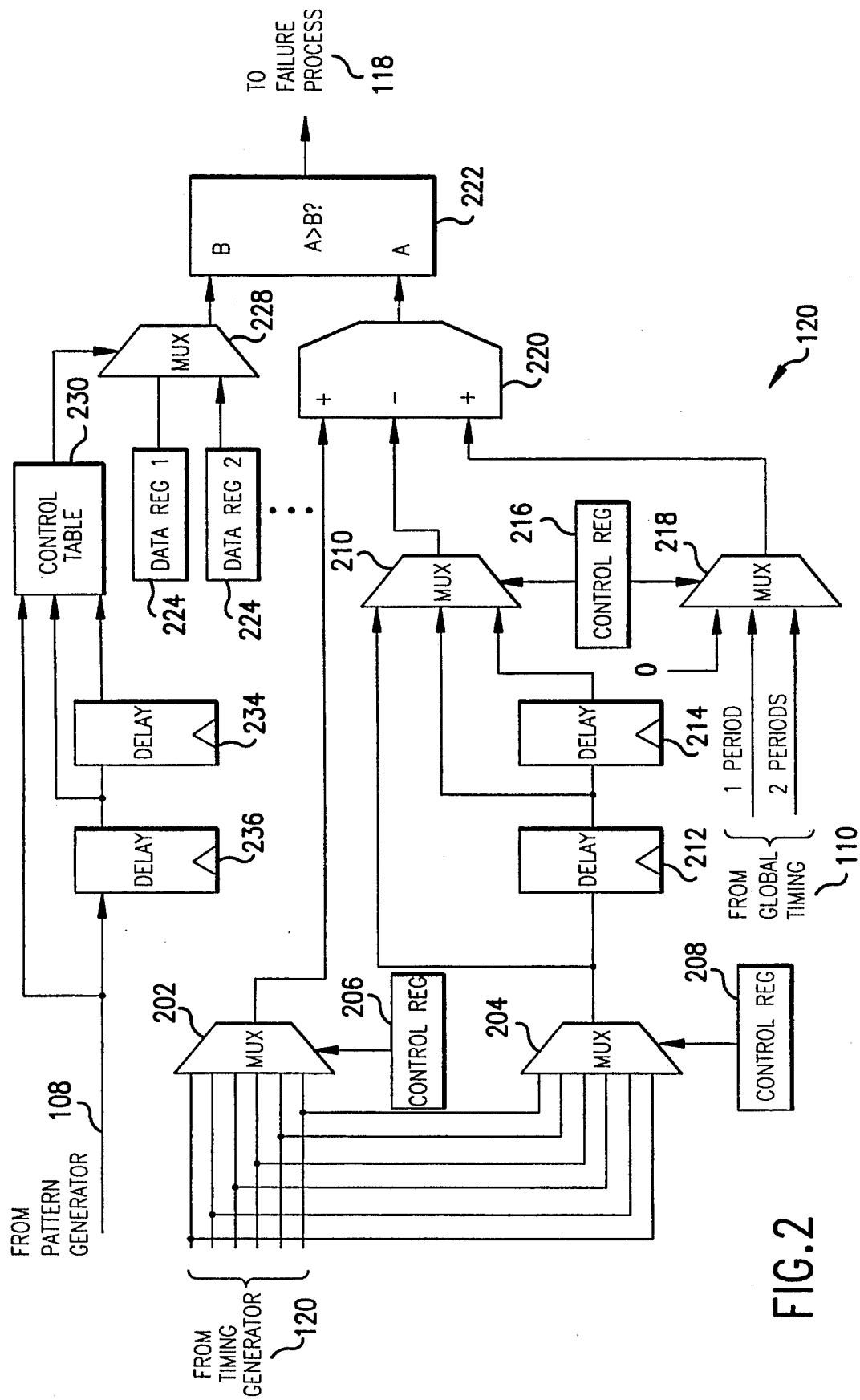
FIG. 2 is block diagram showing the hazard detection circuit of FIG. 1 in greater detail.

Turning now to FIG. 2, hazard detection circuit 120 is shown in greater detail. Inputs representing the programmed time for each edge are provided to mux 202 and mux 204. Here, six input lines are shown because a typical tester generates six edges on which various events happen. However, the number of edges is not critical to the invention. Also, the programmed timed for each edge is shown as a single line. It will be appreciated that the edge placement information is represented as a digital signal with several bits. The number of bits for each edge is dictated by the resolution with which an edge can be placed and is also not critical to the invention.

Mux 202 is controlled by control register 206 and mux 204 is controlled by control register 208. Control registers are connected to system bus 106 (FIG. 1) and receive control information from controller 102. The values in control registers 206 and 208 dictate for which edges placement information will be provided by muxes 202 and 204. To check for a specific timing hazard, the time between two edges must be determined. Which two edges depends on the type of hazard being detected. Accordingly, the values loaded into control registers 206 and 208 are selected by controller 102 (FIG. 1) based on the specific hazard being detected.

The edge placement information selected by mux 202 is passed directly to subtractor 220. The edge placement information selected by mux 204, is passed to a chain of delay elements 212 and 214. Each of the delay elements 212 and 214 delays the edge placement information one period before outputting it. The output of mux 204 is passed directly to an input of mux 210, as is the output of each of the delay elements 212 and 214.

The three inputs to mux 210 thus represent edge placement information for the edge selected by mux 204 at three different times: in the current period; one period before the current period; and two periods before the current period. Mux 210 selects one of these values based on the information in control register 216, which is also supplied by controller 102.

To detect intra-period hazards, it is necessary to compare edge placement information for two edges in the same period. Thus, for detecting intra-period hazards, mux 210 is programmed to pass the edge placement information directly from mux 204 to subtractor 220. However, to detect an inter-period hazard, it is necessary that edge placement information from a prior period be selected and mux 210 is programmed accordingly.

Subtractor 220 computes the difference in edge placement for the two selected edges. Where the edge placement selected by mux 210 is from a prior period, an adjustment is necessary. The edge placement information represents the time from the start of a period that the edge should occur. If the signal selected by mux 210 was generated in a prior period, then this value must be offset by one period. Likewise, if the value selected by mux 210 is from two periods in the past, the value must be offset by two periods. Accordingly, mux 218 is also controlled by control register 216 and selects a correction factor of zero, one or two periods based on whether the input to subtractor 220 from mux 210 reflects an edge placement in the current period, one period previous or two periods previous.

Signals indicating the length of a period are normally generated by a tester and can be supplied to mux 218 from any convenient point, such as from timing generator 120.

The output of subtractor 220 reflects the time difference between the placement of two edges. To determine if a hazard exists, this time difference must be compared to the minimum allowed time difference in the timing specification for tester 100 (FIG. 1). Accordingly, the output of subtractor 220 is provided to comparator 222. The other input to comparator 222 represents minimum allowed time difference and is provided by mux 228.

As described above, the minimum allowed time difference between the placement of two edges sometimes depends on the specific data to be output by drive comparator 116 (FIG. 1) as well as the format of that data. Accordingly, mux 228 selects an appropriate value for the minimum time difference from one of the data registers 224. Here, only two such data registers 224 are shown for clarity. However, it would be most preferable if there were at least as many data registers 224 as there are conditions for which the minimum allowed time difference between any two edges is different.

Data values are written into data registers 224 by controller 102 depending on the specific hazard being detected. Selection of the appropriate data value is controlled by control table 230. Control table 220 is a RAM that has been written into by controller 102. At any given time, it contains information about one hazard.

Each location in control table 230 is addressed by a combination of the data and format values provided to driver/comparator circuit 116 (FIG. 1) in the present period, one period in the past and two periods in the past. Each location stores the control input which would need to be provided to mux 228 to select the data register 224 which has been loaded for the minimum allowed time between the selected edges for the sequence of format and data values which addresses that location.

The addresses information to control table 230 is derived from pattern generator 108. The data and format values from pattern generator 108 are provided directly to control table 230. They are also delayed by one period by delay element 236 and by a second period by delay element 234. The outputs of each of these delay elements are also provided to the address inputs of control table 230.

Figure 3:
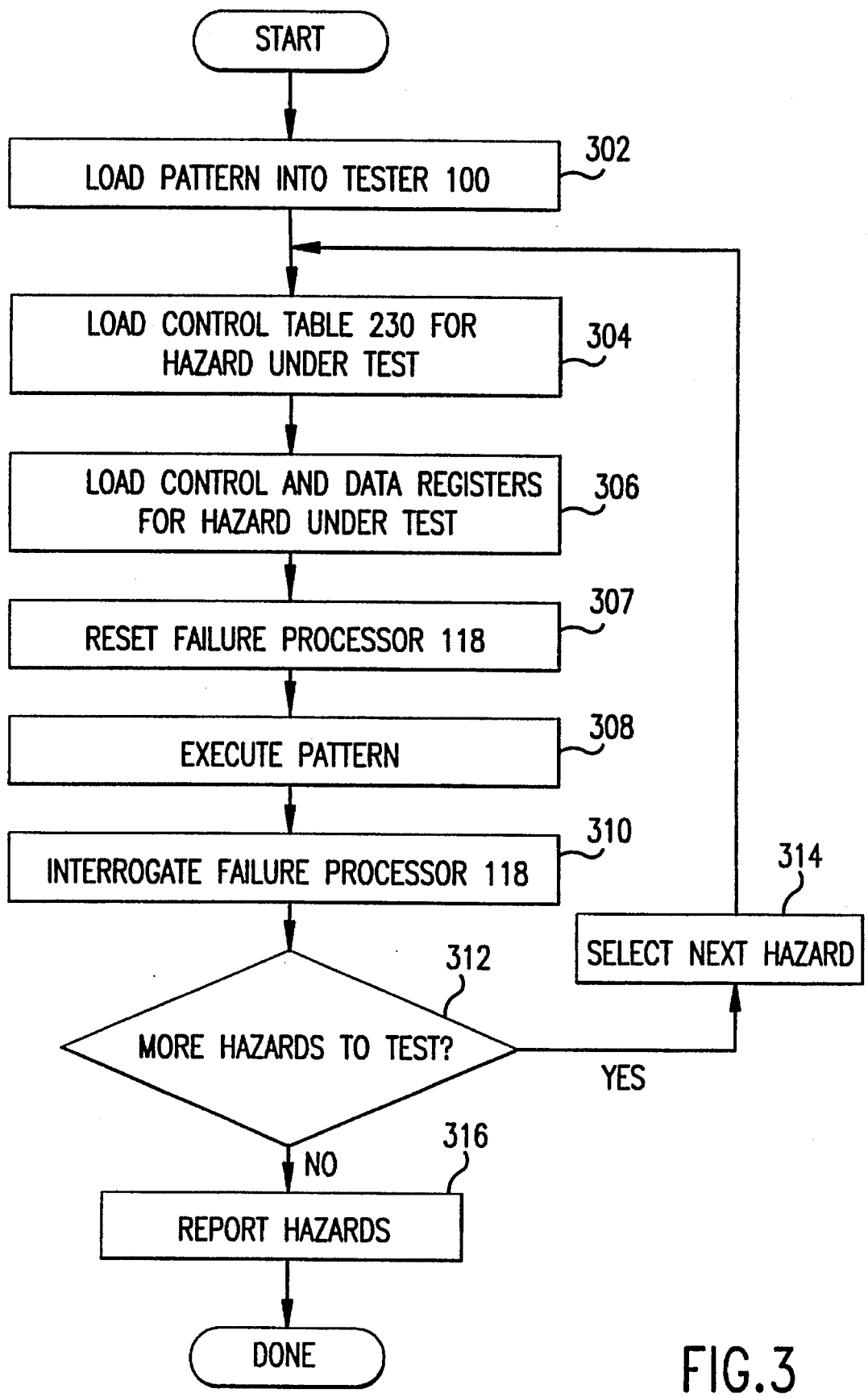
FIG. 3 is a flow chart illustrating a method of detecting timing hazards according to the invention.

Turning now to FIG. 3, a flow chart of a program is shown that could be run on controller 102 (FIG. 1) to check for hazards in pattern. Execution of the program begins at step 302 when the pattern to be tested is loaded into tester 100.

At step 304, values are loaded into control table 230 for the specific hazard to be located. At step 306, control registers 206, 208 and 216 are loaded to specify the two edges involved in the hazard. Data registers 224 are loaded to specify all the different minimum timing values in the tester specification for those two edges. At step 307 the failure processor is reset.

At step 308, the pattern is executed. The pattern is executed when controller 102 (FIG. 1) sends control signals to pattern generator 108 (FIG. 1). During execution of the pattern, the hazard detection circuit 120 for each of the pins 104 monitors the timing, format and data for that pin during each period. Any detected hazards are stored in failure processor 118.

At the end of the pattern execution at step 310, controller 102 interrogates the failure processor to retrieve the information about each hazard detected during execution of the pattern.

At step 312, controller 102 determines if there are more hazards which need to be looked for. If so, execution of the program proceeds to step 314 where the next hazard is selected and steps 304, 306, 308, 310 and 312 are repeated for that hazard.

When the pattern has been repeated for all hazards, execution proceeds to step 316. In step 316, all of the detected hazards are reported. The hazards might simply be reported by producing a list indicating which hazard was detected and the stored information about that hazard. More sophisticated displays might be produced by allowing a user to specify information about only selected hazards, which would then be displayed. Execution of the program ends when the display is completed.

EXAMPLE

A tester could have six user programmable edges denoted d0 to d3, c1 and c2. The circuitry which changes the specified output format operates on edge d0. The drive circuitry goes to a show data state on edge d1 and goes to its return state on edge d2. Circuitry which connects the pin to a specific signal source or comparator operates on edge d3. The comparator which checks if the pin is in a specified state starts the comparison on edge c1 and finishes it on c2.

The timing specification for the tester lists minimum allowed differences between every edge pair for which a minimum exists. For example, one portion of that specification states that the minimum time between edges d1 and d2 is 6 nsec if the state of the output line is to change but only 2 nsec if there is to be no change in the state of the output line. The specification also states that the minimum time difference between edge d1 and the d2 from the prior period is 6 nsec if the state of the output line or the format is to change and 2 nsec if there is to be no change in the state of the output line or format.

This information from the specification reveals two timing hazards which tester 100 can be programmed to detect. Whether any one of these hazards actually occurs upon the execution of a particular vector depends on the specified drive format and drive data.

The tester could operate in one of two drive formats: 1) return low (an output line returns to a low state after an output data pulse); or 2) non-return (an output line stays in the driven state until another value is specified). One bit of data is used in each period to represent which format state is to be used. A 0 value for this bit indicates a return low drive format and a 1 indicates a non-return format.

The tester of this example can drive either a 1 or a 0. A second data bit is used for each period to specify the drive data.

The combination of drive bit and format bit in the current and prior periods dictates which minimum timing value from the specification should be used in checking for hazards. If the return to low format is used and the drive data is 0, the state of the output line will not change from 0. The 2 nsec minimum which applies if the state of the output line does not change applies for this combination of values. The information about what is the minimum time difference between edges can be tabulated as follows for each hazard:

TABLE I

| HAZARD #1: INTRA-PERIOD D1 TO D2 | | | | | | |
|---|---|---|---|---|---|---|
| CURRENT PERIOD DATA | CURRENT PERIOD FORMAT | PRIOR PERIOD DATA | PRIOR PERIOD FORMAT | PENULTIMATE PERIOD DATA | PENULTIMATE PERIOD FORMAT | MINIMUM TIME DIFFERENCE |
| x | 1 | x | x | x | x | 2 nsec |
| 1 | 0 | x | x | x | x | 2 nsec |
| 0 | 0 | x | x | x | x | 6 nsec |

As in a conventional logic diagram represents don't care states. This table shows that data that is programmed into hazard detection circuit 120 to detect a specific hazard. To check for hazard #1, the information in Table I is used. Each unique time difference is written into a data register 224. In Table I, there are two unique time differences, 2 nsec and 6 nsec. A value of 2 nsec is written to the data register 224 selected when a 0 control input is applied to mux 228 and a value of 6 nsec is written into the data register 224 selected when a 1 control input is applied to mux 228. The first six columns specify the address in control table 230. The last column indicates the value stored at that address. An entry of 2 nsec indicates a 0 and an entry of 6 nsec indicates a 1 is stored in the addressed location of control table 230.

To check for hazard #1, a control value is written into control register 206 which causes mux 202 to select edge d2. A value is written into control register 208 which causes mux 204 to select edge d1. Since hazard #1 is an intra-period hazard, a value is written into control register 216 which causes mux 210 to select the undelayed output of mux 204.

With the hardware setup with these values, the pattern would be executed and any vectors which generated values in violation of hazard #1 would be detected.

Having described one embodiment of the invention, various alternative embodiments might be made. For example, it was described that various control and data registers in hazard detection circuit 120 are written into by controller 102 for each hazard being detected. The required control information and data could alternatively be stored in a ROM, one address for each hazard to be tested. The system could be set for each type of hazard by providing an address to the ROM.

Likewise, control table 230 was described as a RAM which was reloaded for each type of hazard to be detected. It could also be a ROM set up in a page mode. One page would be dedicated to each type of hazard to be detected and would be selected by providing a page address. Control table 230 could alternatively be implemented as any other configurable logic circuit.

It should also be noted that many of the timing and data signals mentioned above are used in multiple places in a tester. Accordingly, the signals may be derived from the most convenient point in the tester.

It was also described that information about a hazard was stored in the same failure processor that is used to store failure information. No such restriction need be imposed. A separate failure processor could be used to store the required information about each detected hazard. In fact, if a separate failure processor is used for hazard information, it would be possible to detect hazards while a DUT was being tested for failures.

Also, it was described that the circuitry for detecting hazards was incorporated into a tester. While such an arrangement is desirable because it makes use of the large amounts of memory and high speed circuitry for executing a pattern already in a tester, it is not essential to the invention. A stand alone hazard detector accelerator could be built including hazard detector 120 and sufficient surrounding circuitry needed to provide the signals used by hazard detector circuit 120.

FIG. 2 shows chains of two delay elements such as 212, 214 and 234, 236. Chains of two delay elements allow for testing of hazards which occur over three periods. If the presence of a hazard depends on timing, data and format values which occur over more than three periods, it is necessary to add more delay elements to the chains of delay elements and to expand control table 230 and muxes 210 and 218 accordingly. However, since hazards which occur over such long time frames account for such a small fraction of all hazards, it might not be desirable to add hardware to detect such a small percentage of hazards.

It is also not necessary that all possible hazards be detected by hazard detector 120. For example, it was described that there were as many registers 224 as there are possible different minimum time differences between any two edge signals. Some timing conditions might be very unlikely to occur and so hardware to test for them might not be included. Alternatively, some hazards might be very easy to detect by conventional hazard detection software. Accordingly, the invention might be used in conjunction with conventional software which has been minimized to detect only a very few hazards. An alternative way to reduce the number of registers 224 would be to run multiple passes on the pattern. Different values could be loaded into the registers 224 on each pass in a time multiplexed fashion. Other forms of time multiplexing might also be used to reduce the amount if circuitry required. For example, FIG. 1 shows one hazard detection circuit 120 for each pin. A smaller number of hazard detection circuits could be used if detection circuits are switched to different pins on successive passes through the pattern.

A further variation in the hazard detection method of the invention might be to modify the execution of the pattern while checking for hazards to increase the speed of the hazard detection algorithm. For example, as shown in FIG. 2, hazard detection is performed by checking only three adjacent periods of the pattern. Accordingly, there is no reason to execute any portion of a pattern which repeats more than three times. The pattern might be adjusted in software to reduce all loop counters to three or all loop counters might be set in hardware to a maximum of three.

Various optional features might be included. For example, in FIG. 3, it is shown that all hazards are reported at the end of the test. It would be possible to have each hazard reported as it is detected. Also, for some combinations of edges, data and formats, it is not possible for a hazard to exist. In these circumstances, it might be convenient if control table 230 disabled the output of comparator 222 and control circuitry to perform this disable function might be included. Further, the circuit of FIG. 2 is configured to detect hazards wherein two edges have been programmed too close together. By inverting the inputs to comparator circuit 222, or by any other convenient means, the circuit of FIG. 2 could be adapted to detect hazards wherein edges are programmed too far apart.

What is claimed is:

1. A circuit for detecting hardware timing hazards in a test pattern comprising a plurality of vectors, said pattern adapted to run on a tester which generates a plurality of timing signals at programmed times which differ by time differences and performs I/O functions at a pin in response to information in each vector of the pattern, said circuit comprising:

a) means for computing the time difference between the programmed times of a first one of the plurality of timing signals and a second one of the plurality of timing signals;

b) means, responsive to information in at least one vector specifying I/O functions at a pin, for providing a permissible time difference between first and second ones of the plurality of timing signals; and c) means, responsive to the means for computing the time difference and the means for providing a permissible time difference, for indicating if the first and second ones of the plurality of timing signals have been programmed at times which violate the permissible time difference.

2. The circuit of claim 1:

a) wherein the plurality of timing signals comprises at least two timing signals; and b) said circuit additionally comprises means, coupled to the means for computing, for selecting the programmed time of the first one of the plurality of timing signals from the at least two timing signals; and c) means, coupled to the means for computing, for selecting the programmed time of the second one of the plurality of timing signals from the at least two timing signals.

3. The circuit of claim 2 wherein the means for selecting the first one of the plurality of timing signals comprises means for selecting a timing signal associated with a first vector and the means for selecting the programmed time of the second timing signal comprises means for selecting the programmed time of a second timing signal associated with either the first or a second vector.

4. The circuit of claim 3 wherein the programmed times of the timing signals in the first and second vectors are specified in relation to the start of a period of the tester in which the vector is executed and additionally comprising means, coupled to the means for computing, for providing the time difference between the periods in which the first and second vectors are executed.

5. The circuit of claim 4 wherein the means for providing a permissible time difference is responsive to the information specifying I/O values in the first and second vectors.

6. The circuit of claim 5 wherein the first and second vectors are separated in time by at least one intervening period of the tester and the means for providing permissible time difference is also responsive to the information specifying I/O values in the vector executed in the intervening period.

7. The circuit of claim 1 wherein the means for providing permissible time differences comprises a plurality of means for storing data and a means for selecting the data stored in one of the plurality of storing means.

8. The circuit of claim 7 additionally comprising a control means for providing control information to the means for selecting the first and second timing signals and for loading data into the means for storing data.

9. The circuit of claim 1 wherein the information specifying I/O values specifies whether the pin is to drive data, the format of the drive data and the data value at the pin.

10. A circuit for detecting hardware timing hazards in a test pattern comprising a plurality of vectors, said pattern adapted to run on a tester which generates, during successive periods, a plurality of timing signals in response to information in each vector of the pattern, said circuit comprising:

a) a comparator having a first and second inputs;

b) a first multiplexer having an output coupled to the first input of the comparator and a plurality of data inputs;

c) a plurality of data storage locations, each one coupled to one of the plurality of data inputs of the first multiplexer;

d) an arithmetic circuit having an output coupled to the second input of the comparator and at least a first input and a second input;

e) a second multiplexer having an output coupled to the first input of the arithmetic circuit and a plurality of inputs adapted to receive signals which specify when each timing signal is to occur; and f) a third multiplexer having an output coupled to the second input of the arithmetic circuit and a plurality of inputs adapted to receive signals which specify when each timing signal is to occur.

11. The circuit of claim 10 wherein the output of the third multiplexer is coupled to the arithmetic circuit through a fourth multiplexer, said fourth multiplexer having an output coupled to the second input of the arithmetic circuit and an input coupled to the output of the third multiplexer, said circuit additionally comprising a digital delay line having an input and a plurality of nodes, the input being coupled to the output of the third multiplexer and each of the plurality of nodes being coupled to inputs of the fourth multiplexer.

12. The circuit of claim 11 wherein the arithmetic circuit has a third input, said circuit additionally comprising a means, coupled to the third input, for providing the time difference between the start of selected periods of the tester.

13. The circuit of claim 11 additionally comprising control circuitry coupled to the control input of the first multiplexer, said control circuitry having inputs adapted to receive information specifying the signals at a pin of the tester.

14. The circuit of claim 13 additionally comprising a delay line adapted to receive information specifying the signals at a pin of the tester, said delay line having a plurality of nodes, with each node coupled to an input of the control circuitry.

15. A tester having a plurality of channels which executes a pattern of test vectors and during execution of each vector generates a plurality of edges, each vector being executed at successive periods of the tester and each vector containing information specifying when each edge is to occur, said tester comprising:

a) a computer having a plurality of control outputs;

b) timing generation circuitry having outputs specifying, for each of the plurality of channels, when each of the plurality of edges is to occur; and c) a plurality of timing hazard detection circuits, each coupled to the outputs of the timing generation circuitry for one channel, each said timing hazard detection circuit having an output indicating a hazard and a plurality of inputs coupled to the control outputs of the computer, wherein each hazard detection circuit comprises:

i) means for computing the time difference between the programmed times of a first one of the plurality of timing signals and a second one of the plurality of timing signals;

ii) means, responsive to information in at least one vector specifying I/O functions at a pin, for providing a permissible time difference between first and second ones of the plurality of timing signals; and iii) means, responsive to the means for computing the time difference and the means for providing a permissible time difference, for indicating if the first and second ones of the plurality of timing signals have been programmed at times which violate the permissible time difference.

16. The tester of claim 15 additionally comprising a failure processor coupled to the outputs of the plurality of hazard detection circuits.

17. A method of operating a tester which generates a plurality of edge signals which control I/O functions to be performed by the tester in successive cycles, the method comprising the steps of:

a) loading a test pattern into memory, the test pattern specifying I/O functions to be performed by the tester during the cycles of the tester's operation;

b) providing control information to circuitry within the tester specifying which one of a plurality of timing hazards is to be detected;

c) executing the test pattern while checking for the specified timing hazard during successive cycles, the step of checking for a timing hazard including comparing the time between selected edge signals to a limit, With the limit varying based on the I/O functions to be performed in those cycles; and d) repeating steps b) and c).

18. The method of claim 17 wherein the step of providing control information specifying the timing hazard comprises providing information to select at least two edge signals and at least two limits on the permissible time between the occurrence of the edges.

19. The method of claim 18 wherein the step of providing control information to select at least two edge signals comprises providing information to select edge signals which may occur in different tester periods.

20. The method of claim 17 additionally comprising the step of running a computer program which detects a subset of the timing hazards.

* * * * *